(12) United States Patent
Kanehira (10) Patent No.: US 11,133,566 B2
(45) Date of Patent: Sep. 28, 2021

(54) BRANCH-LINE DIRECTIONAL COUPLER AND POWER AMPLIFIER DEVICE

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventor: Tooru Kanehira, Hino (JP)

(73) Assignees: KABUSHIKI KAISHA TOSHIBA, Minato-ku (JP); TOSHIBA INFRASTRUCTURE SYSTEMS & SOLUTIONS CORPORATION, Kawasaki (JP)

( * ) Notice: Subject to any disclaimer, the term of this patent is extended or adjusted under 35 U.S.C. 154(b) by 17 days.

(21) Appl. No.: 16/646,014

(22) PCT Filed: Jul. 16, 2019

(86) PCT No.: PCT/JP2019/027859
§ 371 (c)(1),
(2) Date: Mar. 10, 2020

(87) PCT Pub. No.: WO2020/059270
PCT Pub. Date: Mar. 26, 2020

(65) Prior Publication Data
US 2020/0266517 A1    Aug. 20, 2020

(30) Foreign Application Priority Data

Sep. 18, 2018  (JP) ............................. JP2018-174058

(51) Int. Cl.
*H01P 5/18* (2006.01)
*H01P 5/22* (2006.01)
*H04B 1/04* (2006.01)

(52) U.S. Cl.
CPC ................ *H01P 5/187* (2013.01); *H01P 5/22* (2013.01); *H04B 1/04* (2013.01)

(58) Field of Classification Search
CPC ..................................... H01P 5/18; H01P 5/22
See application file for complete search history.

(56) References Cited

U.S. PATENT DOCUMENTS 3,593,208 A * 7/1971 Smith ..................... H01P 5/185
                                                          333/112
5,235,296 A * 8/1993 Saka ....................... H01P 5/227
                                                          333/109

(Continued)

FOREIGN PATENT DOCUMENTS

JP      4-207203 A      7/1992
JP      7-93526 A       4/1995

(Continued)

OTHER PUBLICATIONS

International Search Report dated Aug. 13, 2019 in PCT/JP2019/027859 filed Jul. 16, 2019 (with English translation of categories of cited documents), 4 Pages.

(Continued)

*Primary Examiner* — Dean O Takaoka
(74) *Attorney, Agent, or Firm* — Oblon, McClelland, Maier & Neustadt, L.L.P.

(57) ABSTRACT

A branch line directional coupler has a first line, a second line, a first open-ended coupled circuit, and a second open-ended coupled circuit. The first and second lines have a first characteristic impedance and a quarter wavelength length. The first open-ended coupled line has one end connected to the first line and the other end connected to the second line. The second open-ended coupled line has one end connected to the first line and the other end connected to the second line. The first open-ended coupled line has two coupled lines having a coupling length of a quarter wavelength, an open (Continued)

stub, and a connecting line, and has a total length of one-half wavelength. The second open-ended coupled line includes two coupled lines having a coupling length of ¼-wavelength, open stubs, and a connecting line, and has a total length of ½-wavelength.

7 Claims, 10 Drawing Sheets

(56) References Cited

U.S. PATENT DOCUMENTS

| | | | | |
|---|---|---|---|---|
| 5,304,961 | A | * | 4/1994 | Dydyk ............ H03H 7/48 333/112 |
| 2002/0113666 | A1 | * | 8/2002 | Yamazaki ............ H01P 5/187 333/109 |
| 2002/0123363 | A1 | | 9/2002 | Hildebrand et al. |
| 2011/0273242 | A1 | | 11/2011 | Totani et al. |
| 2014/0111285 | A1 | | 4/2014 | Rogers |

FOREIGN PATENT DOCUMENTS

| | | |
|---|---|---|
| JP | 2002-228692 A | 8/2002 |
| WO | WO2010/082346 A1 | 7/2010 |

OTHER PUBLICATIONS

J.W. Gipprich, "A new class of branch-line directional couplers," IEEE MTT-S Digest, 1993, pp. 589-592.

Nobuo Nakajima, et al., "Design of Broadband Branch-Line Hybrid with Loose Coupling Utilizing Open-/Short-Circuited Coupled Transmission Lines," The Institute of Electronics, Information and Communication Engineers, IEICE Technical Report MW2013-201, Mar. 2014, pp. 23-27 (with unedited computer generated English translation).

International Preliminary Report on Patentability and Written Opinion dated Apr. 1, 2021 in PCT/JP2019/027859, 6 pages.

* cited by examiner

BRANCH-LINE DIRECTIONAL COUPLER AND POWER AMPLIFIER DEVICE

TECHNICAL FIELD

Embodiments of the invention relates to a branch-line directional coupler and power amplifier device.

BACKGROUND ART

A directional coupler in which the insertion loss is low and loose coupling is possible is desirable in a branch circuit, a combiner circuit, a phase shifter, etc., of high microwave power.

For example, a loosely-coupled directional coupler is possible by increasing the impedance of a pair of branch lines in a branch-line structure.

It is possible to increase the impedance by using short-ended coupled lines as the pair of branch lines.

However, the insertion loss increases when microstriplines are used as the transmission lines included in the short-ended coupled lines. Although the insertion loss can be reduced by using suspended striplines as the transmission lines, the grounding structure to the tubular conductor portion has a mechanically complex structure.

CITATION LIST

Patent Literature

[Patent Literature 1] JP H07-93526 B2

Non-Patent Literature

[Non-patent Literature 1] J. W. Gipprich, "A new class of branch-line directional couplers," IEEE MTT-S Int. Microw. Symp. Dig., pp. 589-592, June 1993.

SUMMARY OF INVENTION

Technical Problem

Providing a branch-line directional coupler and a power amplifier device in which a complex grounding structure is unnecessary and the insertion loss can be reduced.

Technical Solution

A branch-line directional coupler of an embodiment includes a first line, a second line, first open-ended coupled circuits, second open-ended coupled circuits, a third line, a fourth line, a fifth line, and a sixth line. The first line has a first characteristic impedance and a length of ¼-wavelength. The second line has the first characteristic impedance and a length of ¼-wavelength. The first open-ended coupled lines have one end connected to one end of the first line, and another end connected to one end of the second line. The second open-ended coupled lines have one end connected to another end of the first line, and another end connected to another end of the second line. The third line has one end used as a first terminal, and another end connected to a first connection position of the first line and the first open-ended coupled lines. The fourth line has one end used as a second terminal, and another end connected to a second connection position of the first line and the second open-ended coupled lines. The fifth line has one end used as a third terminal, and another end connected to a third connection position of the second line and the first open-ended coupled lines. The sixth line has one end used as a fourth terminal, and another end connected to a fourth connection position of the second line and the second open-ended coupled lines. The first open-ended coupled lines include two coupled lines having coupling lengths of ¼-wavelength, open stubs respectively connected to one end of each of the two coupled lines, and connecting lines connected to the first connection position or the fifth connection position and respectively connected to other ends of the two coupled lines; and the first open-ended coupled lines have total lengths set to ½-wavelength. The second open-ended coupled lines include two coupled lines having coupling lengths of ¼-wavelength, open stubs respectively connected to one end of each of the two coupled lines, and connecting lines connected to the second connection position or the sixth connection position and respectively connected to other ends of the two coupled lines; and the second open-ended coupled lines have total lengths set to ½-wavelength. The coupling degree is set to 20 dB or more.

DESCRIPTION OF EMBODIMENTS

Embodiments of the invention will now be described with reference to the drawings.

Figure 1A:
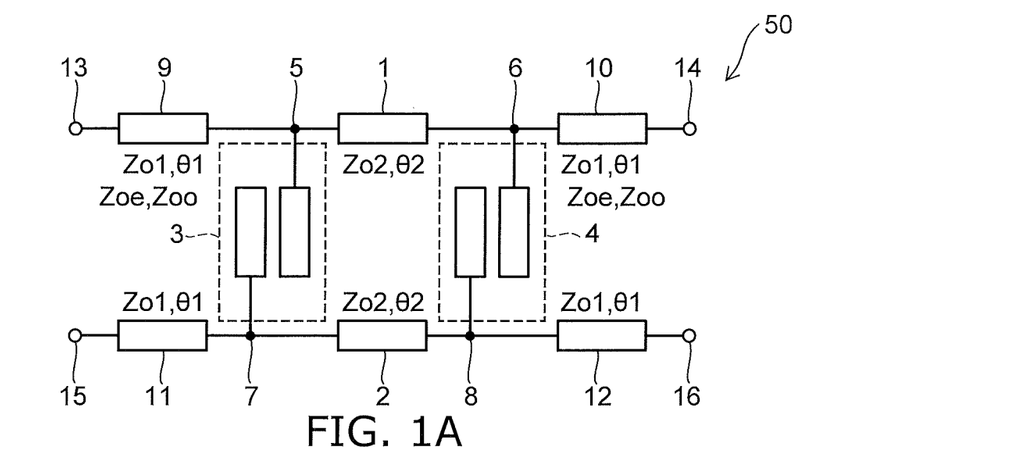
FIG. 1A is an equivalent circuit diagram of a branch-line directional coupler according to a first embodiment.
Figure 1B:
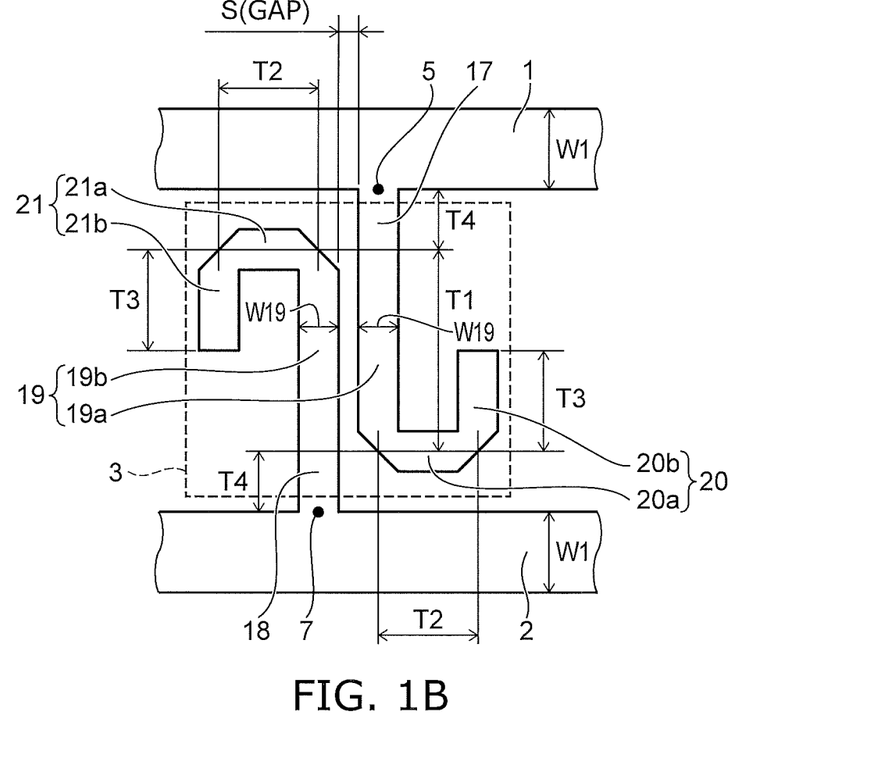
FIG. 1B is a schematic plan view of the line pattern of the open-ended coupled lines.

FIG. 1A is an equivalent circuit diagram of a branch-line directional coupler according to a first embodiment; and FIG. 1B is a schematic plan view of the line pattern of the open-ended coupled lines.

The branch-line directional coupler 50 includes a first line 1, a second line 2, first open-ended coupled lines 3, second open-ended coupled lines 4, a third line 9, a fourth line 10, a fifth line 11, and a sixth line 12.

The first line 1 has a first characteristic impedance Zo2 and a length of ¼-wavelength (in electrical length, θ2). Also, the second line 2 has the first characteristic impedance Zo2 and a length of ¼-wavelength. The first line 1 and the second line 2 form a pair having equivalent transmission characteristics. In the specification, the lengths of the first line 1 and the second line 2 being ¼-wavelength is taken to mean that the electrical lengths of each are not less than 81 degrees and not more than 99 degrees.

The first open-ended coupled lines 3 illustrated by a broken line have one end connected to one end 5 of the first line 1, and another end connected to one end 7 of the second line 2.

The second open-ended coupled lines 4 illustrated by a broken line have one end connected to another end 6 of the first line 1, and another end connected to another end 8 of the second line 2.

The third line 9 is provided between a first terminal 13 and a first connection position 5 of the first line 1 (the one end thereof) and the first open-ended coupled lines. The fourth line 10 is provided between a second terminal 14 and a second connection position 6 of the first line 1 (the other end thereof) and the second open-ended coupled lines 4. The fifth line 11 is provided between a third terminal 15 and a third connection position 7 of the second line 2 (the one end thereof) and the first open-ended coupled lines 3. The sixth line 12 is provided between a fourth terminal 16 and a fourth connection position 8 of the second line 2 (the other end thereof) and the second open-ended coupled lines 4.

The third to sixth lines 9 to 12 have the same characteristic impedance Zo1. Also, the third to sixth lines 9 to 12 have the same length (in electrical length, θ1).

As illustrated in FIG. 1B, the first open-ended coupled lines 3 include two coupled lines 19a and 19b having a coupling length T1 of ¼-wavelength (electrical length, 90 degrees), first sections (lengths T2) of the open stubs 20a and 21a respectively connected to one end of each of the two coupled lines, second sections 20b and 21b (lengths T3) of the open stubs, and connecting lines 17 and 18 (lengths T4) connected to the first connection position 5 or the third connection position 7 and respectively connected to other ends of the two coupled lines; and the first open-ended coupled lines have total lengths (=T1+T2+T3+T4) set to ½-wavelength.

Similarly, the second open-ended coupled lines 4 include two coupled lines having coupling lengths of ¼-wavelength, open stubs respectively connected to one end of each of the two coupled lines, connecting lines connected to the second connection position 6 or the sixth connection position 8 and respectively connected to other ends of the two coupled lines; and the second open-ended coupled lines 4 have total lengths set to 2/2-wavelength. The first open-ended coupled lines 3 and the second open-ended coupled lines 4 form a pair having equivalent characteristics.

The branch-line directional coupler 50 can be loosely coupled by increasing the impedance of the first open-ended coupled lines 3 as viewed from the first connection position 5, the impedance of the first open-ended coupled lines 3 as viewed from the third connection position 7, the impedance of the second open-ended coupled lines 4 as viewed from the second connection position 6, and the impedance of the second open-ended coupled lines 4 as viewed from the eighth connection position 7. In the specification, "loose coupling" is taken to mean that the coupling degree is 20 dB or more.

The first line 1 and the second line 2 widths each are taken as W1. Also, a gap S and line widths W19 of the coupled lines 19 of the first open-ended coupled lines 3 can be determined using an electromagnetic field simulator or the like to have the desired even/odd-mode impedances of the coupled lines. The structure of the second open-ended coupled lines 4 also is set to be similar.

In the specification, the coupling lengths T1 of the coupled lines 19a and 19b of the first open-ended coupled lines and the lengths T1 of the coupled lines of the second open-ended coupled lines 4 being ¼-wavelength is taken to mean that the electrical lengths thereof each are not less than 81 degrees and not more than 99 degrees. Also, in the specification, the total lengths of the first open-ended coupled lines 3 and the total lengths of the second open-ended coupled lines 4 being ½-wavelength is taken to mean that the electrical lengths thereof each are not less than 140 degrees and not more than 216 degrees.

Figure 2:
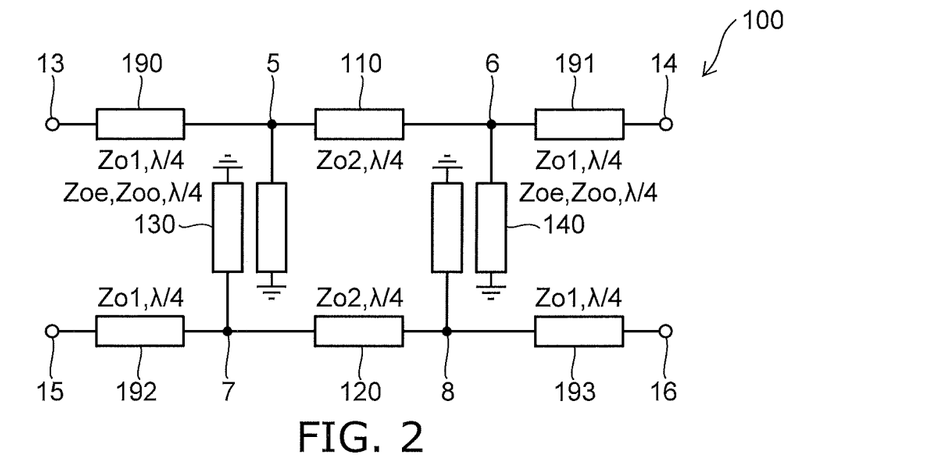
FIG. 2 is an equivalent circuit diagram of a branch-line directional coupler according to a comparative example.

FIG. 2 is an equivalent circuit diagram of a branch-line directional coupler according to a comparative example.

The branch-line directional coupler 100 includes a first line 110, a second line 120, first short-ended coupled lines 130, second short-ended coupled lines 140, a third line 190, a fourth line 191, a fifth line 192, and a sixth line 193.

The first line 110 has the first characteristic impedance Zo2 and a length of ¼-wavelength (in electrical length, 90 degrees). Also, the second line 120 has the first characteristic impedance Zo2 and a length of ¼-wavelength. The first line 110 and the second line 120 form a pair having equivalent transmission characteristics.

In the comparative example, the short-ended coupled lines 130 and 140 are used to increase the impedance for the branch lines forming the pairs as well. In such a case, the shorting structure to the ground conductor is easy when microstriplines or striplines are used as the transmission lines. However, because the dielectric loss becomes large, there are cases where the insertion loss as a directional coupler becomes large, i.e., greater than 0.1 dB, e.g., 1 dB or the like.

Figure 3:
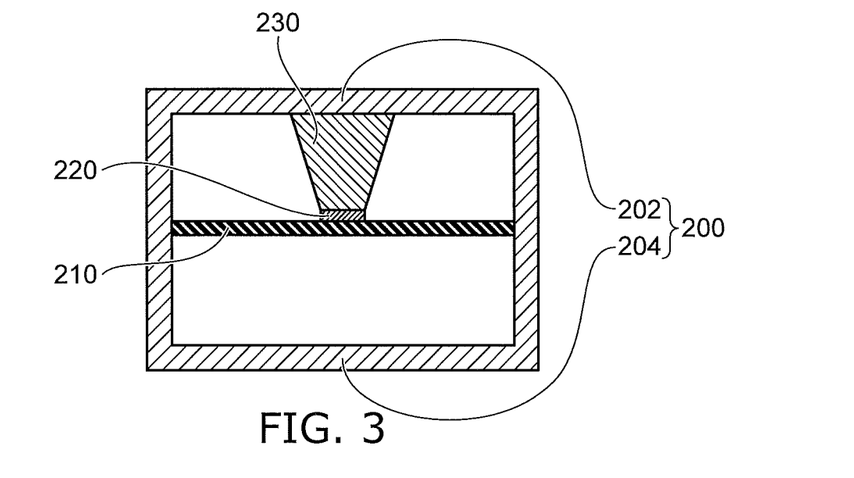
FIG. 3 is a schematic cross-sectional view of a short-ended structure of a suspended stripline.

FIG. 3 is a schematic cross-sectional view of a short-ended structure of a suspended stripline.

The suspended stripline includes a tubular conductor portion 200, a dielectric substrate 210 provided inside the tubular conductor portion 200, and a central conductor portion 220 provided on the dielectric substrate 210. The tubular conductor portion 200 includes an upper conductor 202 and a lower conductor 204. The shorting section includes a shorting conductor portion 230 connecting the central conductor portion 220 and at least one of the upper conductor 202 or the lower conductor 204. However, the grounding structure that connects the central conductor 220 and the shorting conductor portion 230 provided in the tubular conductor portion 200 interior is more complex than the shorting structure of a microstripline. In other words, it is difficult to provide a simple grounding structure in the short-ended coupled lines of the comparative example.

Conversely, by using a suspended stripline structure in the first embodiment, the dielectric loss is reduced; and it is easy to reduce the insertion loss of the directional coupler to be 0.1 dB or less, etc. Also, the open-ended coupled lines can have high impedance with a simple open-ended structure instead of a short-ended structure. Therefore, for example, wide applications are possible to high-output radar devices, high-output phase shifters, etc.

Specific examples of the directional coupler according to the embodiment and the high frequency characteristics of the specific examples obtained by an electromagnetic field simulation will now be described.

Figure 4:
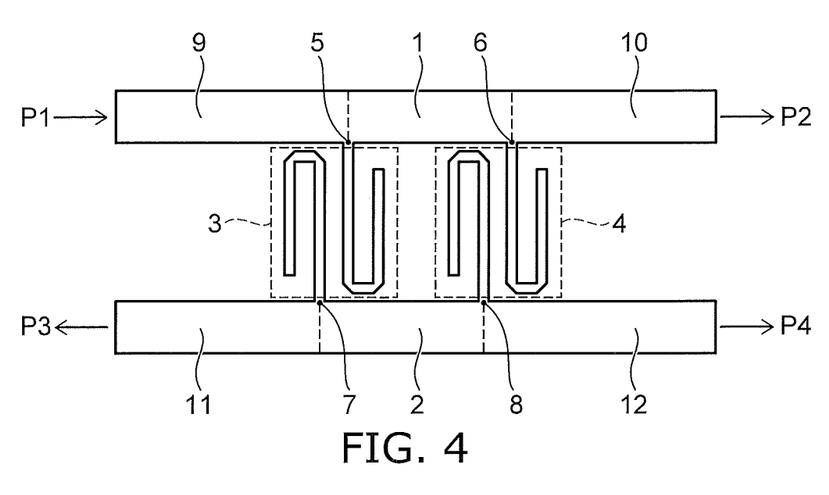
FIG. 4 is a schematic plan view of the directional coupler model for which the electromagnetic field simulation is performed according to a first embodiment.

FIG. 4 is a schematic plan view of the directional coupler model for which the electromagnetic field simulation is performed.

In the simulation, a power P1 is input to the third line 9. A power P2 from the fourth line 10, a power P3. from the fifth line 11, and a power P4 from the sixth line 12 are output.

A power ratio 1 is represented by Formula (1); and the absolute value of the power ratio 1 is defined as an insertion loss IL (dB).

Power ratio 1=−IL(dB)=−10 log(P1/P2)  Formula (1)

A power ratio 2 is represented by Formula (2); and the absolute value of the power ratio 2 is defined as a coupling degree C. (dB).

Power ratio 2=−C(dB)=−10 log(P1/P4))  Formula (2)

A power ratio 3 is represented by Formula (3); and the absolute value of the power ratio 3 is defined as an isolation IS (dB).

Power ratio 3=−IS(dB)=−10 log(P1/P3)  Formula (3)

A directionality DI (dB) is represented by Formula (4).

DI=IS−C  Formula (4)

A power ratio 4 is a return loss RL1 (dB) when viewed from the first terminal 13.

A power ratio 5 is a return loss RL2 (dB) when viewed from the third terminal 15.

A power ratio 6 is a return loss RL3 (dB) when viewed from the fourth terminal 16.

(Table 1) illustrates the relationships between the line lengths and the characteristics for specific examples A to J of the embodiment.

| MODEL SYMBOL | CONNECTING LINES 17, 18 [mm] | COUPLED LINES 19 [mm] | OPEN STUBS 20, 21 [mm] [mm] | | INSERTION LOSS @9.5 GHz [dB] | COUPLING DEGREE @9.5 GHz [dB] | ISOLATION @9.5 GHz [dB] |
|---|---|---|---|---|---|---|---|
| A | 1.20 | 6.40 | 1.50 | 5.30 | 0.07 | 31.4 | 54.6 |
| B | 0.70 | | 1.50 | 5.80 | 0.08 | 27.1 | 56.1 |
| C | 0.95 | | 1.25 | 5.80 | 0.07 | 29.3 | 54.0 |
| D | 0.95 | | 1.50 | 5.55 | 0.07 | 29.9 | 56.4 |
| E | 1.20 | | 1.25 | 5.55 | 0.08 | 29.0 | 50.9 |
| F | 1.20 | | 2.00 | 4.80 | 0.07 | 32.9 | 49.7 |
| G | 1.20 | | 2.50 | 4.30 | 0.07 | 32.6 | 39.9 |
| H | 1.70 | | 1.25 | 5.05 | 0.06 | 31.0 | 52.6 |
| I | 1.70 | | 1.50 | 4.80 | 0.06 | 31.5 | 53.6 |
| J | 1.70 | | 2.00 | 4.30 | 0.06 | 32.7 | 51.9 |

Figure 5:
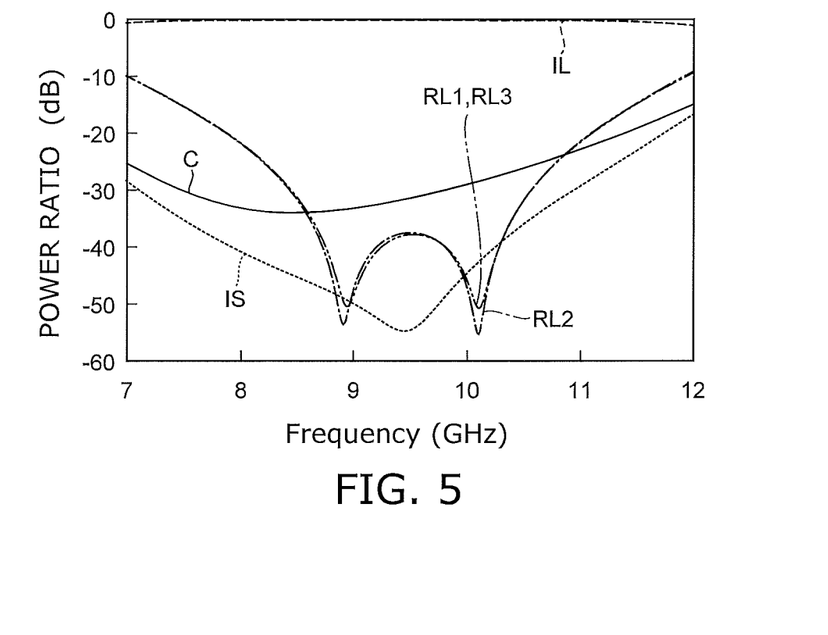
FIG. 5 is a graph illustrating the characteristics of the directional coupler of the specific example A of the first embodiment.
Figure 6:
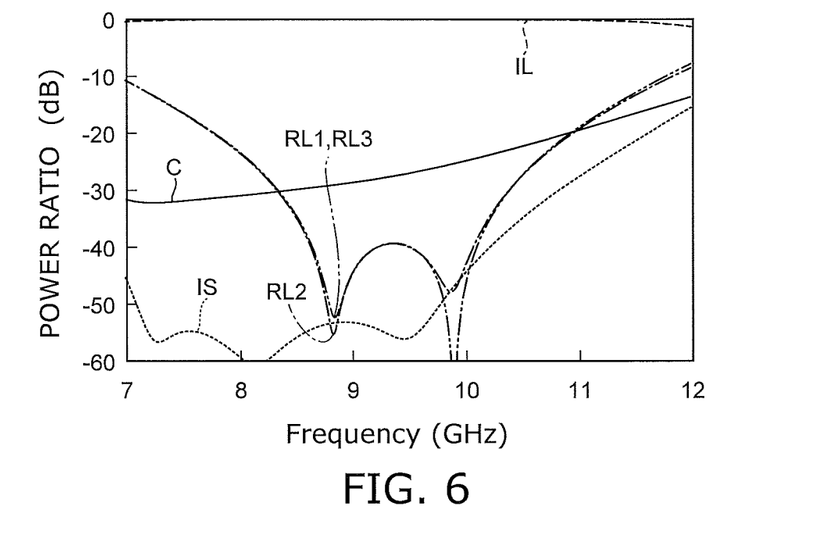
FIG. 6 is a graph illustrating the characteristics of the directional coupler of the specific example B of the first embodiment.
Figure 7:
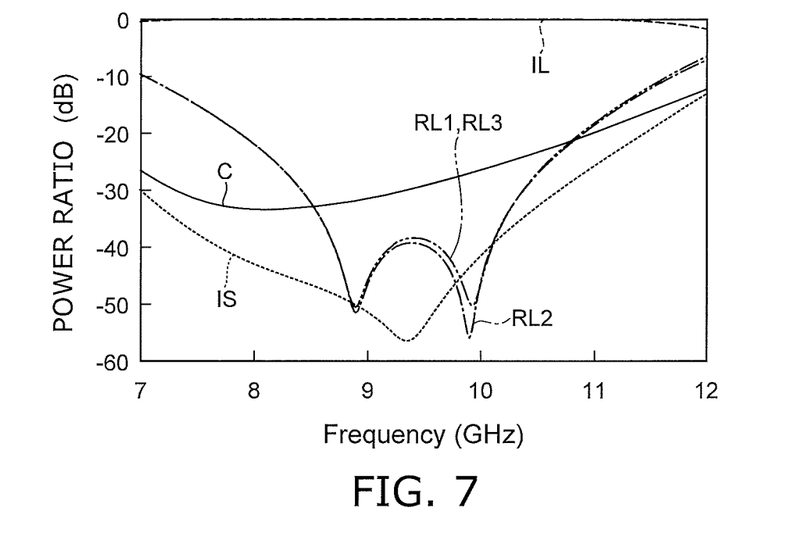
FIG. 7 is a graph illustrating the characteristics of the directional coupler of the specific example C of the first embodiment.
Figure 8:
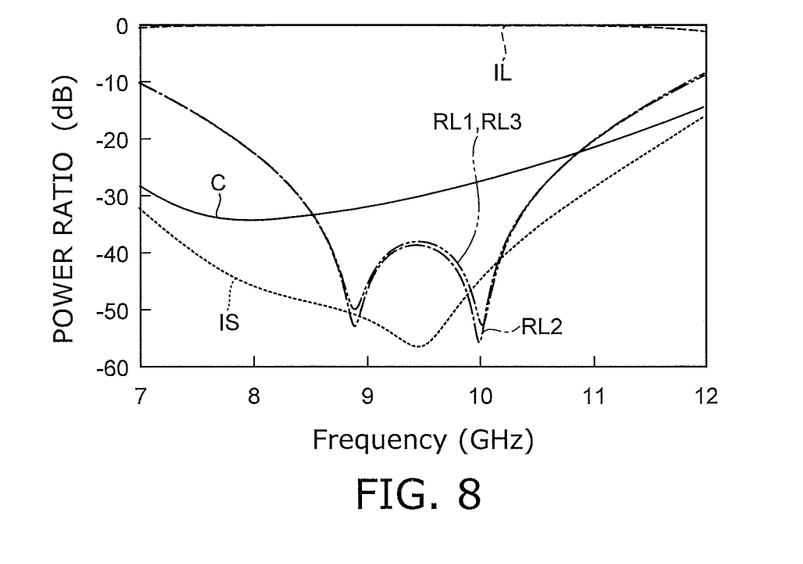
FIG. 8 is a graph illustrating the characteristics of the directional coupler of the specific example D of the first embodiment.
Figure 9:
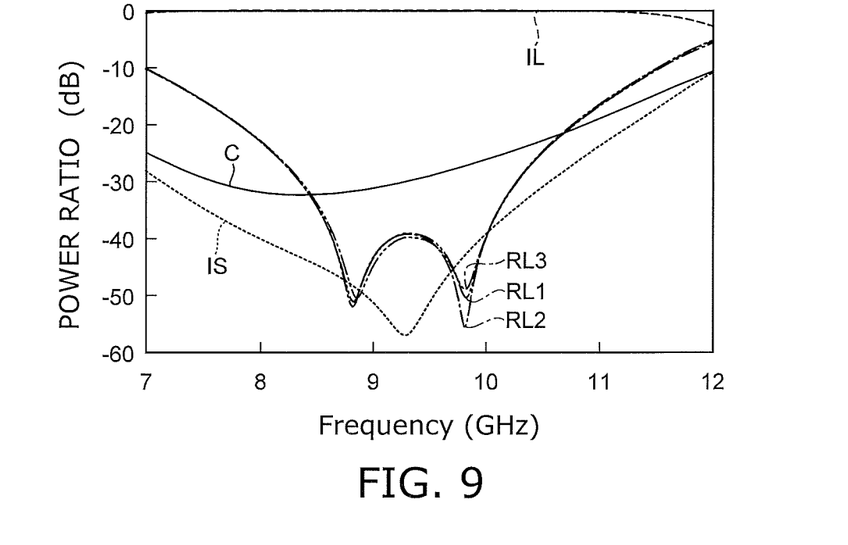
FIG. 9 is a graph illustrating the characteristics of the directional coupler of the specific example E of the first embodiment.
Figure 10:
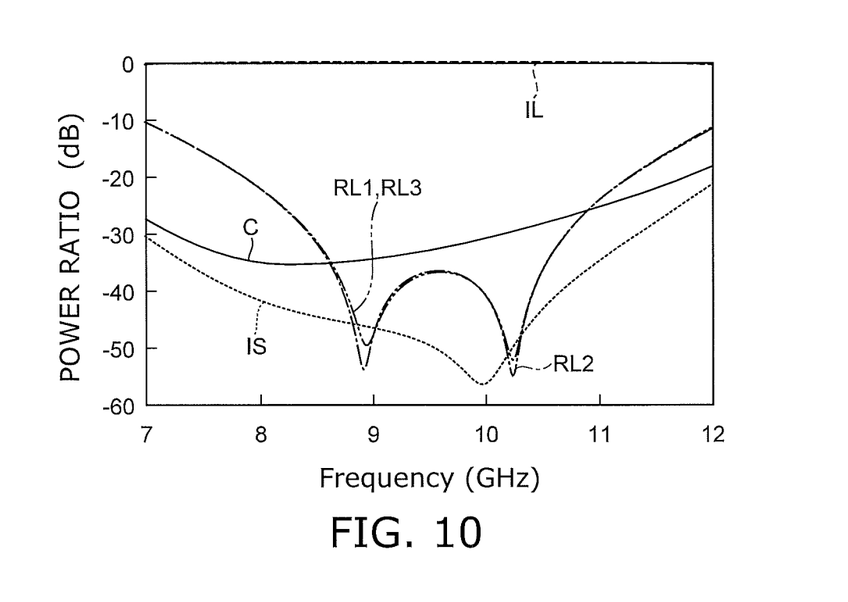
FIG. 10 is a graph illustrating characteristics of the directional coupler of the specific example F of the first embodiment.
Figure 11:
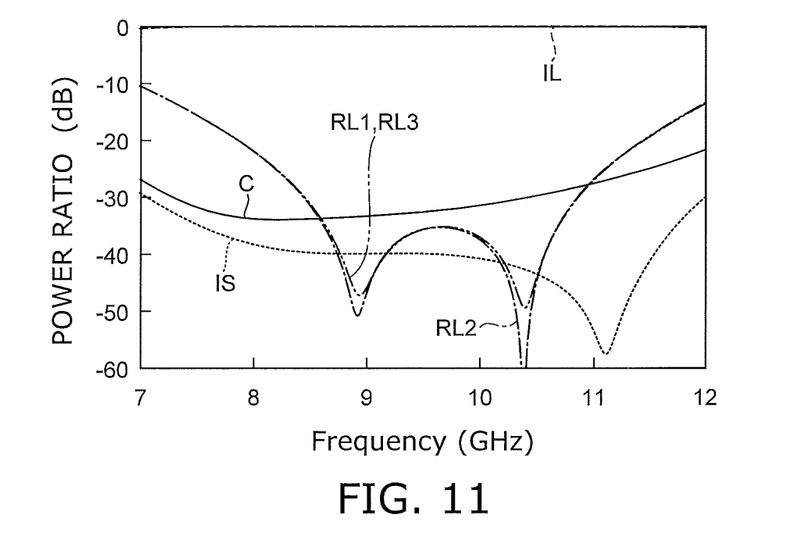
FIG. 11 is a graph illustrating the characteristics of the directional coupler of the specific example G of the first embodiment.
Figure 12:
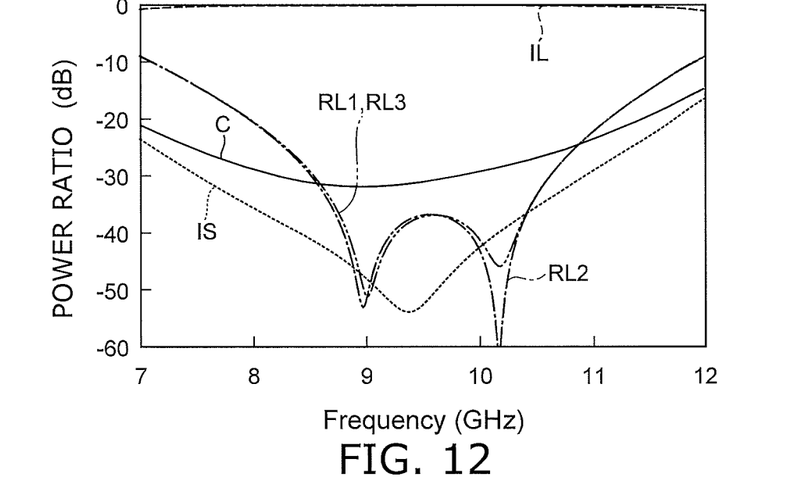
FIG. 12 is a graph illustrating the characteristics of the directional coupler of the specific example H of the first embodiment.
Figure 13:
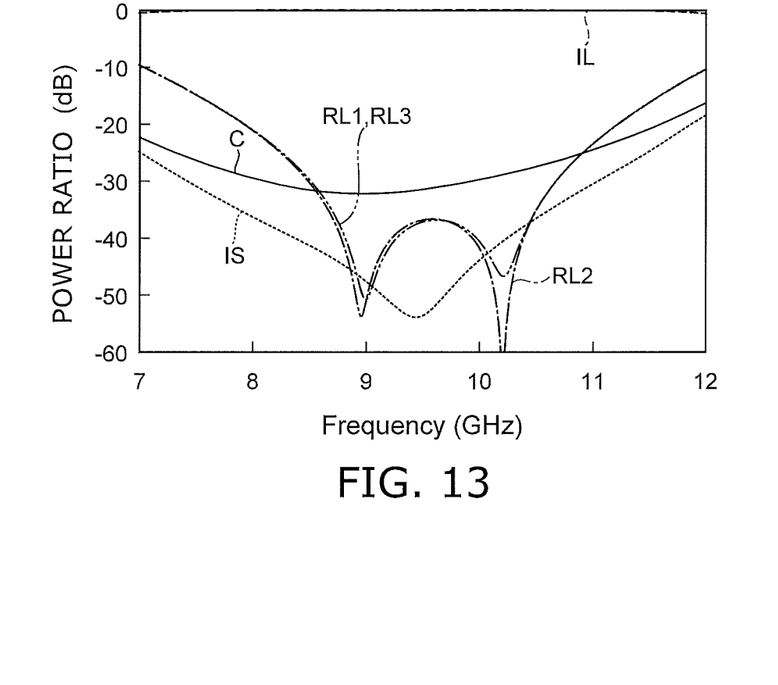
FIG. 13 is a graph illustrating the characteristics of the directional coupler of the specific example I of the first embodiment.
Figure 14:
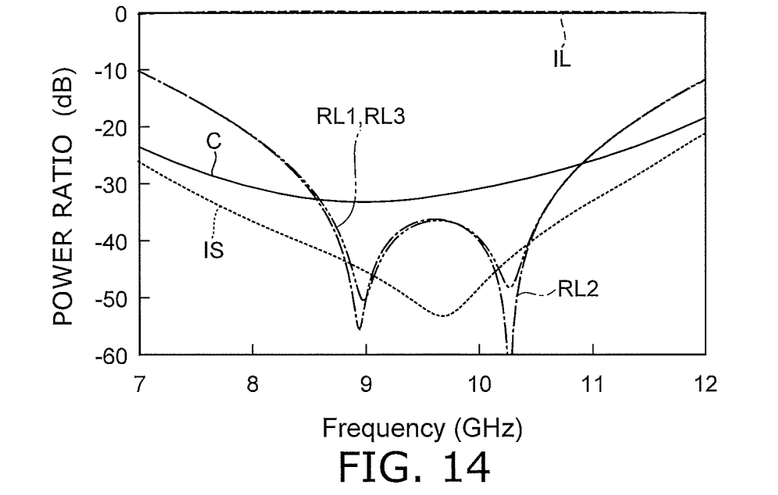
FIG. 14 is a graph illustrating the characteristics of the directional coupler of the specific example J of the first embodiment.

| MODEL SYMBOL | FREQUENCY BAND OBTAINING DIRECTIONALITY OF 10 dB OR MORE [GHz] | FRACTIONAL BANDWIDTH | MODEL | RF CHARACTERISTICS |
|---|---|---|---|---|
| A | 8.3~10.5 | 22.5% | FIG. 4 | FIG. 5 |
| B | 6.9~10.8 | 40.9% | FIG. 4 | FIG. 6 |
| C | 8.1~10.4 | 24.9% | FIG. 4 | FIG. 7 |
| D | 7.8~10.6 | 29.4% | FIG. 4 | FIG. 8 |
| E | 8.3~10.3 | 21.3% | FIG. 4 | FIG. 9 |
| F | 8.7~10.9 | 23.9% | FIG. 4 | FIG. 10 |
| G | 10.1~11.8 | 18.2% | FIG. 4 | FIG. 11 |
| H | 8.5~10.3 | 18.9% | FIG. 4 | FIG. 12 |
| I | 8.5~10.4 | 19.4% | FIG. 4 | FIG. 13 |
| J | 8.8~10.6 | 18.9% | FIG. 4 | FIG. 14 |

For the specific examples A to J of (Table 1), the characteristic impedances Zo2 of the first line 1 and the second line 2 each are set to 50Ω; and the line widths W1 (FIG. 1B) are set to 2.5 mm. The line widths W19 of the first and second open-ended coupled lines 3 and 4 are set to 0.5 mm; and the gaps S (FIG. 1B) are set to 0.9 mm. These numerical values are examples; and the structure of the embodiment is not limited to these numerical values. Also, (Table 1) is a specific example of branch-line directional couplers in which the coupling degree C. is 27.1 to 32.7 dB at a center frequency of 9.5 GHz. The transmission lines were set to be suspended striplines.

Specific Example A

FIG. 5 is a graph illustrating the characteristics of the directional coupler of the specific example A of the first embodiment.

The vertical axis illustrates the power ratios 1 to 6 (dB values); and the horizontal axis illustrates the frequency (GHz). The center frequency is set to 9.5 GHz. In the open-ended coupled lines 3 illustrated in FIG. 1B, the lengths T4 of the connecting lines 17 and 18 are set to 1.2 mm; the lengths T1 of the coupled lines 19 are set to 6.4 mm; and the lengths (T2+T3) of the open stubs 20 and 21 are set to 6.8 mm. As a result, the total lengths of the lengths of the open-ended coupled lines 3 are set to 14.4 mm. This total length is a common value for the specific examples B to J.

At 9.5 GHz, an insertion loss IL of 0.07 dB, a coupling degree C. of 31.4 dB, an isolation IS of 54.6 dB, and a directionality DI of 10 dB or more are obtained. Also, the bandwidth where the directionality DI of 10 dB or more is obtained is 8.3 to 10.5 GHz; and the fractional bandwidth is 22.5%. Also, at about the 8.9 and 10.1 GHz vicinities, the return losses of the first terminal 13, the third terminal 15, and the fourth terminal 16 are well-matched. Therefore, the requirements as a loosely-coupled directional coupler are satisfied.

Specific Example B

FIG. 6 is a graph illustrating the characteristics of the directional coupler of the specific example B of the first embodiment.

The lengths T4 of the transmission lines 17 and 18 are set to be shorter than those of the specific example A, i.e., 0.7 mm. Also, at 9.5 GHz, the insertion loss IL is 0.08 dB; the coupling degree C. is 27.1 dB (a slight decrease); and the isolation IS is 56.1 dB. Therefore, the high frequency characteristics are shifted to the low-frequency side; and the fractional bandwidth widens to 40.9%.

Specific Example C

FIG. 7 is a graph illustrating the characteristics of the directional coupler of the specific example C of the first embodiment.

The lengths T4 of the connecting lines 17 and 18 are set between those of the specific example A and the specific example B. Also, the lengths T2 of the open stubs 20a and 21a are set to be shorter than those of the specific example A; and the lengths T3 of the open stubs 20b and 21b are set to be longer than those of the specific example A. Also, at 9.5 GHz, the insertion loss IL is 0.07 dB; the coupling degree C. is 29.3 dB; and the isolation IS is 54.0 dB. Compared to the specific example A, the high frequency characteristics are shifted slightly to the low-frequency side.

Specific Example D

FIG. 8 is a graph illustrating the characteristics of the directional coupler of the specific example D of the first embodiment.

The lengths T4 of the connecting lines 17 and 18 are set to lengths between those of the specific example A and the specific example B; and the lengths T3 of the open stubs 20b and 21b are set to be longer than those of the specific example A.

Specific Example E

FIG. 9 is a graph illustrating the characteristics of the directional coupler of the specific example E of the first embodiment.

The open stubs 20a and 21a are set to be shorter than those of the specific example A; and the open stubs 20b and 21b are set to be longer than those of the specific example A. At 9.5 GHz, the insertion loss IL is 0.08 dB; the coupling degree C. is 29.0 dB; the isolation IS is 50.9 dB; and the fractional bandwidth is 21.3%. Therefore, the high-frequency-side frequency decreased (10.3 GHz).

Specific Example F

FIG. 10 is a graph illustrating characteristics of the directional coupler of the specific example F of the first embodiment.

The open stubs 20a and 21a are set to be longer than those of the specific example A; and the open stubs 20b and 21b are set to be shorter than those of the specific example A. At 9.5 GHz, the insertion loss IL is 0.07 dB; the coupling degree C. is 32.9 dB; the isolation IS is 49.7 dB; and the fractional bandwidth is 23.9%. Therefore, the high-frequency-side frequency is reduced (10.3 GHz). The frequency band is shifted further to the high-frequency side than that of the specific example A so that the high-frequency-side frequency is 10.9 GHz.

Specific Example G

FIG. 11 is a graph illustrating the characteristics of the directional coupler of the specific example G of the first embodiment.

The open stubs 20a and 21a are set to be longer than those of the specific example A; and the open stubs 20b and 21b are set to be shorter than those of the specific example A. Further, the degree of the change is larger than that of the specific example F. At 9.5 GHz, the insertion loss IL is 0.07 dB; the coupling degree C. is 32.6 dB; the isolation IS is 39.9 dB; and the fractional bandwidth is 18.2%. Therefore, although the frequency band is shifted to high-frequency side, i.e., 10.1 to 11.8 GHz, the fractional bandwidth is narrow, i.e., 18.2%.

Specific Example H

FIG. 12 is a graph illustrating the characteristics of the directional coupler of the specific example H of the first embodiment.

The connecting lines 17 and 18 are set to be longer than those of the specific example A; the open stubs 20a and 21a are set to be shorter than those of the specific example A; and the open stubs 20b and 21b are set to be shorter than those of the specific example A. At 9.5 GHz, the insertion loss IL is 0.06 dB; the coupling degree C. is 31.0 dB; and the isolation IS is 52.6 dB. The frequency band is 8.5 to 10.3 GHz; and the fractional bandwidth is 18.9% and is narrower than the fractional bandwidth of the specific example A.

Specific Example I

FIG. 13 is a graph illustrating the characteristics of the directional coupler of the specific example I of the first embodiment.

The connecting lines 17 and 18 are set to be longer than those of the specific example A; the open stubs 20a and 21a are set to be the same as those of the specific example A; and the open stubs 20b and 21b are set to be shorter than those of the specific example A. At 9.5 GHz, the insertion loss IL is 0.06 dB; the coupling degree C. is 31.5 dB; and the isolation IS is 53.6 dB. The frequency band is 8.5 to 10.4 GHz; and the fractional bandwidth is 19.4% and is narrower than the fractional bandwidth of the specific example A.

Specific Example J

FIG. 14 is a graph illustrating the characteristics of the directional coupler of the specific example J of the first embodiment.

The connecting lines 17 and 18 are set to be longer than those of the specific example A; the open stubs 20a and 21a are set to be longer than those of the specific example A; and the open stubs 20b and 21b are set to be shorter than those of the specific example A. At 9.5 GHz, the insertion loss IL is 0.06 dB; the coupling degree C. is 32.7 dB; and the isolation IS is 51.9 dB. The frequency band is 8.8 to 10.6 GHz; and the fractional bandwidth is 18.9% and is narrower than the fractional bandwidth of the specific example A.

In other words, (Table 1) shows that the RF characteristics (the coupling degree, the isolation, the frequency band, etc.) can be optimized by performing an electromagnetic field simulation by changing the lengths of the connecting lines 17 and 18, the lengths of the open stubs 20 and 21, etc.

Specific examples in which the coupling degree C. is 20 dB and 40 dB will now be described.

(Table 2) illustrates the relationships between the characteristics and the line lengths of the specific examples L, A, and M in which the coupling degree C. is about 20 dB, 30 dB, and 40 dB.

Figure 15:
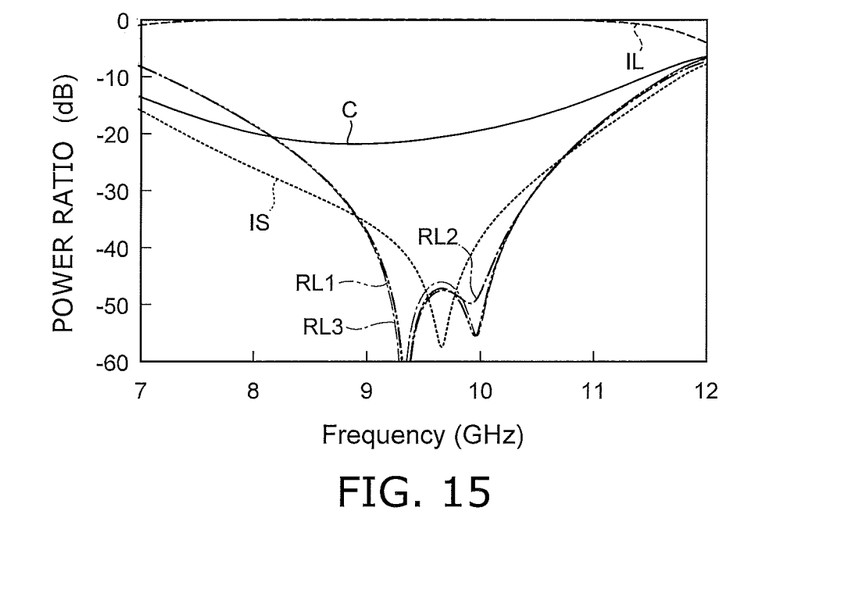
FIG. 15 is a graph illustrating the characteristics of the directional coupler of the specific example L of the first embodiment.

The gap S is set to 0.4 mm. By setting the gap S to be less than 0.9 mm which is the gap S of the specific example A (the coupling degree C. being about 30 dB), the coupling degree C. at the center frequency of 9.5 GHz can be set to about 21.2 dB. Also, at 9.5 GHz, an insertion loss IL of 0.1 dB, an isolation IS of 46.2 dB, and a directionality DI of 25.0 dB or more are obtained.

Specific Example M

Figure 16:
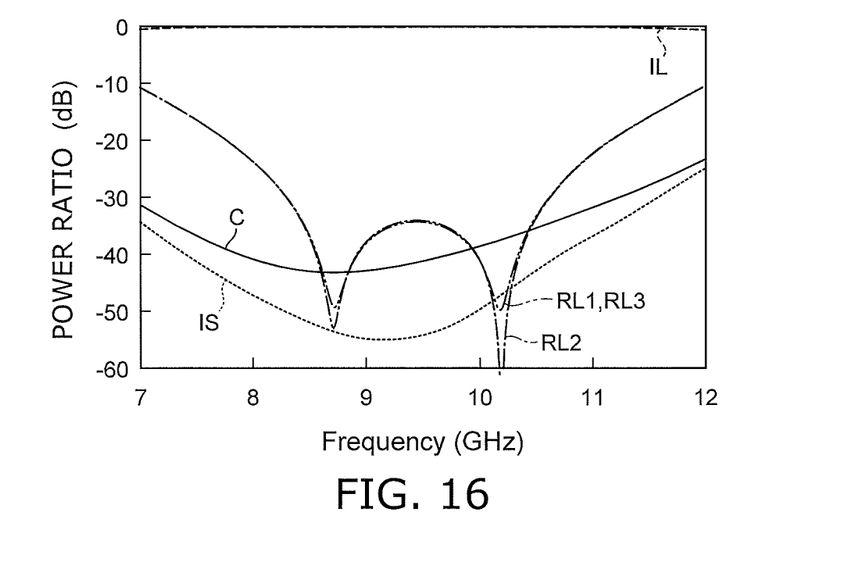
FIG. 16 is a graph illustrating the characteristics of the directional coupler of the specific example M of the first embodiment.

FIG. 16 is a graph illustrating the characteristics of the directional coupler of the specific example M of the first embodiment.

The gap S is set to 1.3 mm. By setting the gap S to be greater than 0.9 mm which is the gap S of the specific example A (the coupling degree C. being about 30 dB), the coupling degree C. at the center frequency of 9.5 GHz can be set to 41.3 dB. Also, at 9.5 GHz, an insertion loss IL of 0.05 dB, an isolation IS of 54.3 dB, and a directionality DI of 13.0 dB or more are obtained. As illustrated in the specific examples A, L, and M, the coupling degree C. can be increased by increasing the gap S.

Power amplifier devices that include the branch-line directional coupler 50 according to the first embodiment will now be described.

Figure 17A:
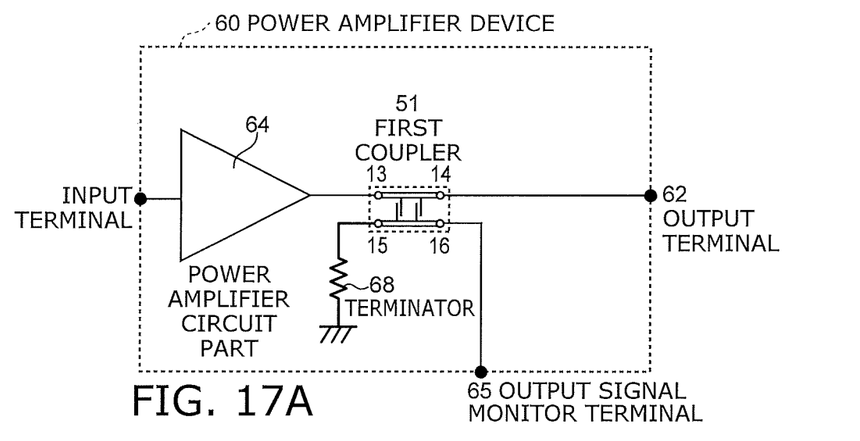
FIG. 17A is a circuit configuration diagram of a power amplifier device according to a third embodiment.
Figure 17B:
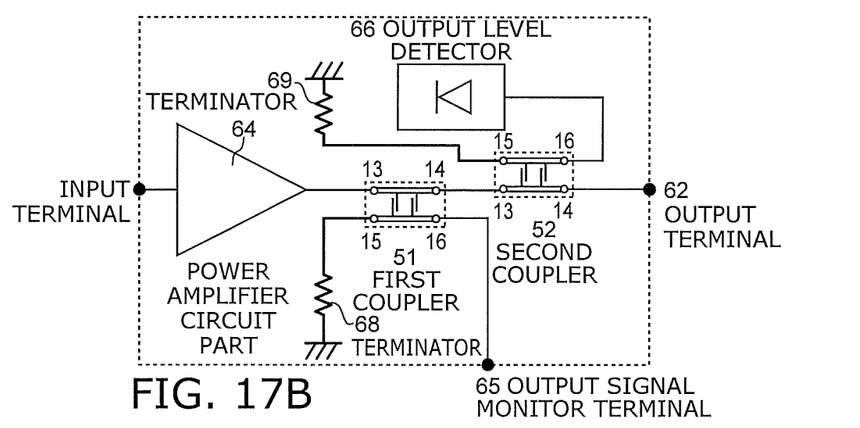
FIG. 17B is a circuit configuration diagram of a first modification of the power amplifier device according to the third embodiment.
Figure 17C:
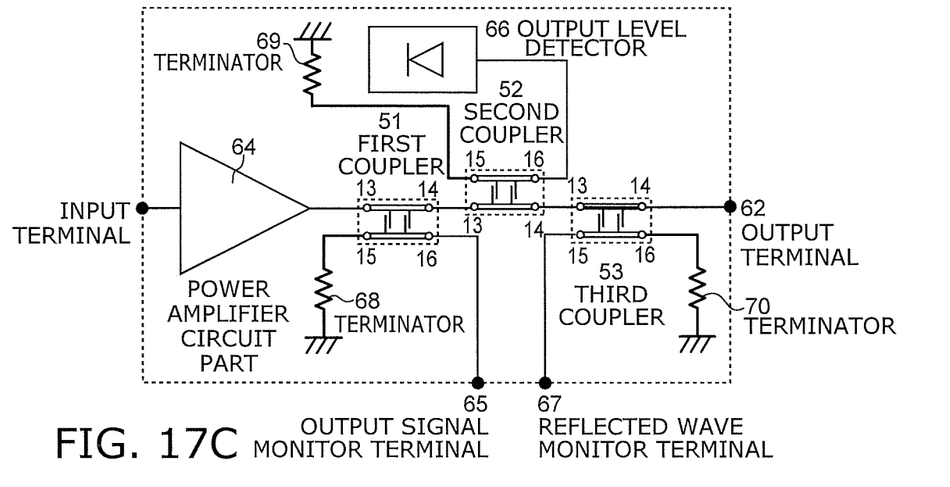
FIG. 17C is a circuit configuration diagram of a second modification of the power amplifier device according to the third embodiment.

FIG. 17A is a circuit configuration diagram of a power amplifier device according to a third embodiment; FIG. 17B is a circuit configuration diagram of a first modification of the power amplifier device according to the third embodiment; and FIG. 17C is a circuit configuration diagram of a second modification of the power amplifier device according to the third embodiment.

| MODEL SYMBOL | W1 [mm] | W19 [mm] | T1 [mm] | T2 [mm] | T3 [mm] | T4 [mm] | S [mm] | INSERTION LOSS @9.5 GHz [dB] | COUPLING DEGREE @9.5 GHz [dB] | ISOLATION @9.5 GHz [dB] | FREQUENCY BAND OBTAINING DIRECTIONALITY OF 10 dB OR MORE [GHz] | FRACTIONAL BANDWIDTH |
|---|---|---|---|---|---|---|---|---|---|---|---|---|
| L | 2.5 | 0.5 | 6.4 | 1.5 | 5.3 | 1.2 | 0.4 | 0.10 | 21.2 | 46.2 | 8.6~10.6 | 20.3% |
| A | 2.5 | 0.5 | 6.4 | 1.5 | 5.3 | 1.2 | 0.9 | 0.07 | 31.4 | 54.6 | 8.3~10.5 | 22.5% |
| M | 2.5 | 0.5 | 6.4 | 1.5 | 4.75 | 1.75 | 1.3 | 0.05 | 41.3 | 54.3 | 8.7~10.1 | 15.7% |

The specific example A is the same as the model symbol A of (Table 1); and the characteristics of the specific example A are illustrated in FIG. 5. Also, similarly to (Table 1), the characteristic impedances Zo2 of the first line 1 and the second line 2 both are set to 50Ω; and the line widths W1 (FIG. 1B) are set to 2.5 mm. The line widths W19 of the first and second open-ended coupled lines 3 and 4 are set to 0.5 mm. Regardless of the coupling degree C., the total lengths (T1+T2+T3+T4) of the open-ended coupled lines are set to 14.4 mm. Also, to suppress the effects due to the coupling of the first line 1 and the open stub 21a and the effects due to the coupling of the first line 2 and the open stub 20a, it is favorable to set S<T4 by adjusting the lengths T3 of the second sections 20b and 21b and the lengths T4 of the connecting lines 17 and 18 of the open stubs. The transmission lines were set to be suspended striplines.

Specific Example L

FIG. 15 is a graph illustrating the characteristics of the directional coupler of the specific example L of the first embodiment.

As illustrated in FIG. 17A, a power amplifier device 60 includes a power amplifier circuit part 64, an output terminal 62, an output signal monitor terminal 65, a first branch-line directional coupler 51, and a first terminator (a terminating resistance) 68.

The power amplifier circuit part 64 can include an amplifying element such as a HEMT (High Electron Mobility Transistor) or the like, as well as a matching circuit, a bias circuit, a power branch circuit, a power combiner circuit, etc., of the amplifying element. Also, a filter that suppresses harmonics may be included in the final part. Also, the power amplifier circuit part 64 may be a MMIC (Monolithic Microwave Integrated Circuit).

The first branch-line directional coupler (a first coupler) 51 is provided between the power amplifier circuit part 64 and the output terminal 62. The first terminal 13 of the first branch-line directional coupler 51 is connected to the output terminal of the power amplifier circuit part 64; the second terminal 14 is connected to the output terminal 62; the third terminal 15 is connected to the first terminator 68; and the fourth terminal 16 is connected to the output signal monitor terminal 65. The monitoring of harmonic (spurious) components, etc., can be performed using the signal extracted via the output signal monitor terminal 65.

As illustrated in the first modification of FIG. 17B, the power amplifier device 60 includes the power amplifier circuit part 64, the output terminal 62, the output signal monitor terminal 65, an output level detector 66, the first branch-line directional coupler (the first coupler) 51, a second branch-line directional coupler (a second coupler) 52, the first terminator 68, and a second terminator (a terminating resistance) 69. The first branch-line directional coupler 51 is provided between the power amplifier circuit part 64 and the output terminal 62. The first terminal 13 of the first branch-line directional coupler 51 is connected to the output terminal of the power amplifier circuit part 64; the third terminal 15 is connected to the first terminator 68; and the fourth terminal 16 is connected to the output signal monitor terminal 65.

The second branch-line directional coupler 52 is provided between the first branch-line directional coupler 51 and the output terminal 62. The first terminal 13 of the second branch-line directional coupler 52 is connected to the second terminal 14 of the first branch-line directional coupler 51; the second terminal 14 is connected to the output terminal 62; the third terminal 15 is connected to the second terminator 69; and the fourth terminal 16 is connected to the output level detector 66. The transmission output level of the power amplifier device 60 output from the output terminal 62 is detected by the output level detector 66 via the fourth terminal 16. If the output level of the power amplifier device 60 becomes high, the power that is input to the output level detector 66 can be reduced by increasing the coupling degree of the second branch-line directional coupler 52.

As illustrated in the second modification of FIG. 17C, the power amplifier 60 includes the power amplifier circuit part 64, the output terminal 62, the output signal monitor terminal 65, the output level detector 66, the reflected wave monitor output terminal 67, the first branch-line directional coupler (the first coupler) 51, the second branch-line directional coupler (the second coupler) 52, a third branch-line directional coupler (a third coupler) 53, the first terminator 68, the second terminator 69, and a third terminator (a terminating resistance) 70. The first terminal 13 of the first branch-line directional coupler 51 is connected to the output terminal of the power amplifier circuit part 64; the third terminal 15 is connected to the first terminator 68; and the fourth terminal 16 is connected to the output signal monitor terminal 65. The first terminal 13 of the second branch-line directional coupler 52 is connected to the second terminal 14 of the first branch-line directional coupler 51; the third terminal 15 is connected to the second terminator 69; and the fourth terminal 16 is connected to the output level detector 66. The first terminal 13 of the third branch-line directional coupler is connected to the second terminal 14 of the second branch-line directional coupler 52; the second terminal 14 is connected to the output terminal 62; the third terminal 15 is connected to the reflected wave monitor terminal 67; and the fourth terminal 16 is connected to the third terminator 70. An antenna or the like is connected as a load to the stage after the output terminal 62.

If an abnormality occurs at the load side and the high-output power is not radiated correctly from the antenna, there are cases where the power reflected at the load side damages the inner parts of the power amplifier device 60 via the output terminal 62, etc. In the second modification, the reflected wave passes through the third terminal 15 of the third branch-line directional coupler 53 and is monitored by the reflected wave monitor terminal 67. In other words, the third branch-line directional coupler 53 is for reflected wave detection and can protect the inner parts of the power amplifier device 60 by rapidly detecting the abnormality of the load with high precision.

According to the embodiment, a loosely-coupled branch-line directional coupler is provided in which a complex grounding structure is unnecessary and the insertion loss can be reduced; and a power amplifier that uses the branch-line directional coupler is provided. The branch-line directional coupler according to the embodiment is widely applicable to high-output radar devices, high-output phase shifters, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A branch-line directional coupler, comprising:
a first line having a first characteristic impedance and a length of ¼-wavelength;
a second line having the first characteristic impedance and a length of ¼-wavelength;
first open-ended coupled lines having one end connected to one end of the first line, and an other end connected to one end of the second line;
second open-ended coupled lines having one end connected to an other end of the first line, and an other end connected to an other end of the second line;
a third line having one end used as a first terminal, and an other end connected to a first connection position of the first line and the first open-ended coupled lines;
a fourth line having one end used as a second terminal, and an other end connected to a second connection position of the first line and the second open-ended coupled lines;
a fifth line having one end used as a third terminal, and an other end connected to a third connection position of the second line and the first open-ended coupled lines; and
a sixth line having one end used as a fourth terminal, and an other end connected to a fourth connection position of the second line and the second open-ended coupled lines,
the first open-ended coupled lines including two coupled lines, open stubs respectively connected to one end of each of the two coupled lines, and connecting lines connected to the first connection position or the fifth connection position and respectively connected to other ends of the two coupled lines, the two coupled lines having coupling lengths of ¼-wavelength, the first open-ended coupled lines having total lengths set to ½-wavelength,
the second open-ended coupled lines including two coupled lines, open stubs respectively connected to one end of each of the two coupled lines, and connecting lines connected to the second connection position or the sixth connection position and respectively connected to other ends of the two coupled lines, the two coupled lines having coupling lengths of ¼-wavelength, the second open-ended coupled lines having total lengths set to ½-wavelength, a coupling degree of the branch-line directional coupler being 20 dB or more.

2. The branch-line directional coupler according to claim 1, wherein the third to sixth lines have equivalent characteristic impedances.

3. The branch-line directional coupler according to claim 1, wherein the third to sixth lines have equivalent lengths.

4. The branch-line directional coupler according to claim 1, wherein the first line, the second line, the first open-ended coupled lines, and the second open-ended coupled lines are suspended striplines.

5. A power amplifier device, comprising:
a power amplifier circuit part;
an output terminal;
an output signal monitor terminal;
a first terminator; and
a first branch-line directional coupler according to claim 1, the first branch-line directional coupler being provided between the power amplifier circuit part and the output terminal and having the first terminal connected to an output terminal of the power amplifier circuit, the second terminal connected to the output terminal, the third terminal connected to the first terminator, and the fourth terminal connected to the output signal monitor terminal.

6. A power amplifier device, comprising:
a power amplifier circuit part;
an output terminal;
an output signal monitor terminal;
an output level detector;
a first terminator;
a second terminator;
a first branch-line directional coupler according to claim 1, the first branch-line directional coupler being provided between the power amplifier circuit part and the output terminal and having the first terminal connected to the output terminal of the power amplifier circuit, the third terminal connected to the first terminator, and the fourth terminal connected to the output signal monitor terminal; and
a second branch-line directional coupler according to claim 1, the second branch-line directional coupler being provided between the first branch-line directional coupler and the output terminal and having the first terminal connected to the second terminal of the first branch-line directional coupler, the second terminal connected to the output terminal, the third terminal connected to the second terminator, and the fourth terminal connected to the output level detector.

7. A power amplifier device, comprising:
a power amplifier circuit part;
an output terminal;
an output signal monitor terminal;
an output level detector;
a reflected wave monitor output terminal;
a first terminator;
a second terminator;
a third terminator;
a first branch-line directional coupler according to claim 1, the first branch-line directional coupler being provided between the power amplifier circuit part and the output terminal and having the first terminal connected to the output terminal of the power amplifier circuit, the third terminal connected to the first terminator, and the fourth terminal connected to the output signal monitor terminal;
a second branch-line directional coupler according to claim 1, the second branch-line directional coupler being provided between the first branch-line directional coupler and the output terminal and having the first terminal connected to the second terminal of the first branch-line directional coupler, the third terminal connected to the second terminator, and the fourth terminal connected to the output level detector; and
a third branch-line directional coupler according to claim 1, the third branch-line directional coupler being provided between the second branch-line directional coupler and the output terminal and having the first terminal connected to the second terminal of the second branch-line directional coupler, the second terminal connected to the output terminal, the third terminal connected to the reflected wave monitor terminal, and the fourth terminal connected to the third terminator.

\* \* \* \* \*